(12) United States Patent
Horng

(10) Patent No.: US 6,489,555 B1
(45) Date of Patent: Dec. 3, 2002

(54) ELASTIC SYSTEM FOR PREVENTING ELECTROMAGNETIC INTERFERENCE TO A COMPUTER CENTRAL PROCESSING UNIT

(76) Inventor: Chin Fu Horng, No. 9, Lane 90, Fu Hsing Rd., Lu Chou City, Taipei Hsiang (TW)

( * ) Notice: Subject to any disclaimer, the term of this patent is extended or adjusted under 35 U.S.C. 154(b) by 0 days.

(21) Appl. No.: 09/930,987

(22) Filed: Aug. 17, 2001

(51) Int. Cl.[7] .................................................. H05K 9/00
(52) U.S. Cl. ........................ 174/35 GC; 174/35 R; 174/35 C; 361/816; 361/818; 277/920
(58) Field of Search ........................ 174/35 GC, 35 R, 174/35 C, 135, 51; 361/816, 818; 439/92, 95, 96; 277/920

(56) References Cited

U.S. PATENT DOCUMENTS

| | | | |
|---|---|---|---|
| 4,754,101 A | * | 6/1988 | Stickney et al. .......... 174/35 R |
| 5,043,528 A | * | 8/1991 | Mohr ...................... 174/35 GC |
| 5,313,016 A | * | 5/1994 | Brusati et al. .......... 174/35 GC |
| 5,600,092 A | * | 2/1997 | Patscheck et al. ..... 174/35 GC |
| 5,672,844 A | * | 9/1997 | Persson et al. ........... 174/35 R |
| 5,934,916 A | * | 8/1999 | Latal et al. .................... 439/95 |
| 6,359,215 B1 | * | 3/2002 | Horng ................... 174/35 GC |

* cited by examiner

Primary Examiner—Dean A. Reichard
Assistant Examiner—W. David Walkenhorst
(74) Attorney, Agent, or Firm—Rosenberg, Klein & Lee

(57) ABSTRACT

An elastic system for preventing electromagnetic interference to a computer central processing is disclosed. Two lateral sides of the contact surface and the welding surface are extended with a vertical upper stopper and a vertical lower stopper; upper portions of the upper stopper and the lower stopper are alternatively arranged. Therefore, each elastic conductive piece has a closed structure. No outer object will be hooked or fall thereinto. A hole is formed on the welding surface. Since the welding surface is combined to the computer mainframe board through a tin glue. Therefore, the computer mainframe board has a preferred sticky force.

2 Claims, 5 Drawing Sheets

ELASTIC SYSTEM FOR PREVENTING ELECTROMAGNETIC INTERFERENCE TO A COMPUTER CENTRAL PROCESSING UNIT

FIELD OF THE INVENTION

The present invention relates to an elastic system for preventing electromagnetic interference to a computer central processing. Two lateral sides of the contact surface and the welding surface are extended with a vertical upper stopper and a vertical lower stopper; upper portions of the upper stopper and the lower stopper are alternatively arranged.

BACKGROUND OF THE INVENTION

Referring to FIG. 1, a schematic view for the elastic system for preventing electromagnetic interference to a computer central processing unit in the prior art is illustrated. In the present invention, each elastic conductive piece 1a is installed with a piece-like contact surface 11a. The outer side of the contact surface 11a has a sheet portion 12a extended therefrom. A first bending angle portion R1a is formed therebetween. The free end of the sheet portion 12a extends downwards to form a piece-like welding surface 13a and a second bending angle portion R2a is formed therebetween. An enhanced portion 16a is formed between the lower edge of the second bending angle portion R2a and the welding surface 13a. A selective tilt surface 17a is formed between the lower end of the enhanced portion 16a and the welding surface 13a. Two sides of the welding surface 13a are bent upwards to be formed with vertical lateral plates 14a. Thereby, as the elastic conductive piece 1a is pressed, the stress of the second bending angle portion R2a, welding surface 13a, and tin glue (not shown) will disperse so as to prevent the combining portion from breaking.

Since two sides of the elastic conductive piece are opened, as it is assembled to a computer, it is easily that the contact surface 11a of the elastic conductive piece 1a will hook the outer object so that the elastic conductive piece 1a deform as illustrated in FIG. 2. Therefore, other unexpected object, such as cotton pieces, will enter computer mainframe board so to remain therein.

The inner surface of the second bending angle portion R2 has a configuration with respect to the inner surface of the first bending angle portion R1. A hole 19 is formed on the welding surface 13. Since the welding surface 13 is combined to the computer mainframe board 3 through a tin glue 4. Therefore, the computer mainframe board 3 has a preferred sticky force. Two lateral sides of the contact surface 11 and the welding surface 13 are extended with a vertical upper stopper 15 and a vertical lower stopper 18. The upper portions of the upper stopper 15 and, the lower stopper 18 are alternatively arranged. Therefore, each elastic conductive piece has a closed structure. No outer object will be hooked or fall thereinto.

SUMMARY OF THE INVENTION

Accordingly, the primary object of the present invention is to provide an elastic system for preventing electromagnetic interference to a computer central processing unit, wherein two lateral sides of the contact surface and the welding surface are extended with a vertical upper stopper and a vertical lower stopper; upper portions of the upper stopper and the lower stopper are alternatively arranged.

Another object of the present invention is to provide an elastic system for preventing electromagnetic interference to a computer central processing unit, wherein each elastic conductive piece has a closed structure. No outer object will be hooked or fall thereinto.

A further object of the present invention is to provide an elastic system for preventing electromagnetic interference to a computer central processing unit, wherein a hole is formed on the welding surface. Since the welding surface is combined to the computer mainframe board through a tin glue. Therefore, the computer mainframe board has a preferred sticky force.

The various objects and advantages of the present invention will be more readily understood from the following detailed description when read in conjunction with the appended drawing.

DETAILED DESCRIPTION OF THE PREFERRED EMBODIMENTS

Figure 1:
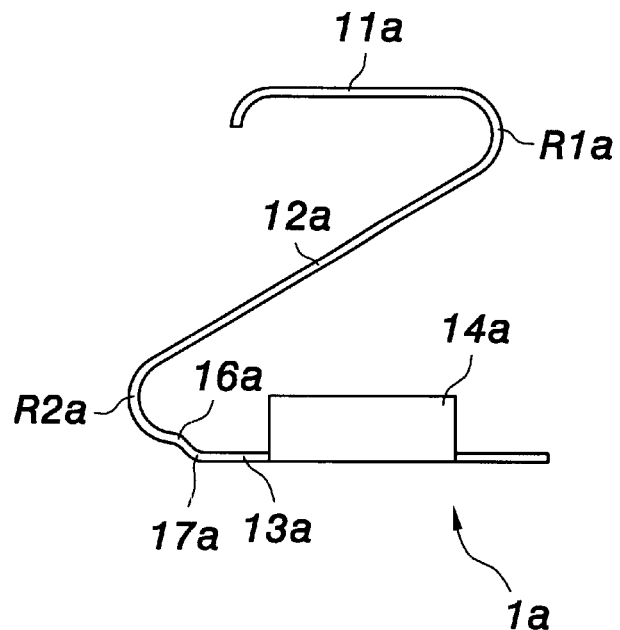
FIG. 1 is a schematic view of the elastic system for preventing electromagnetic interference to a computer central processing unit in the prior art.
Figure 2:
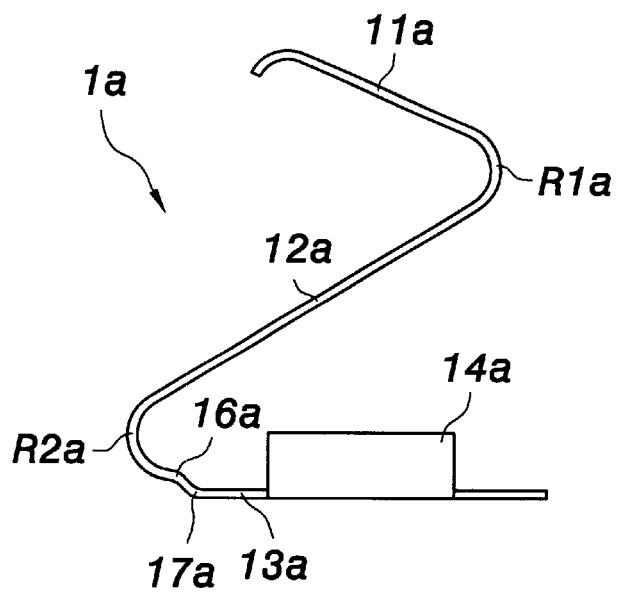
FIG. 2 is a schematic view showing that the elastic system of FIG. 1 has deformed.
Figure 3:
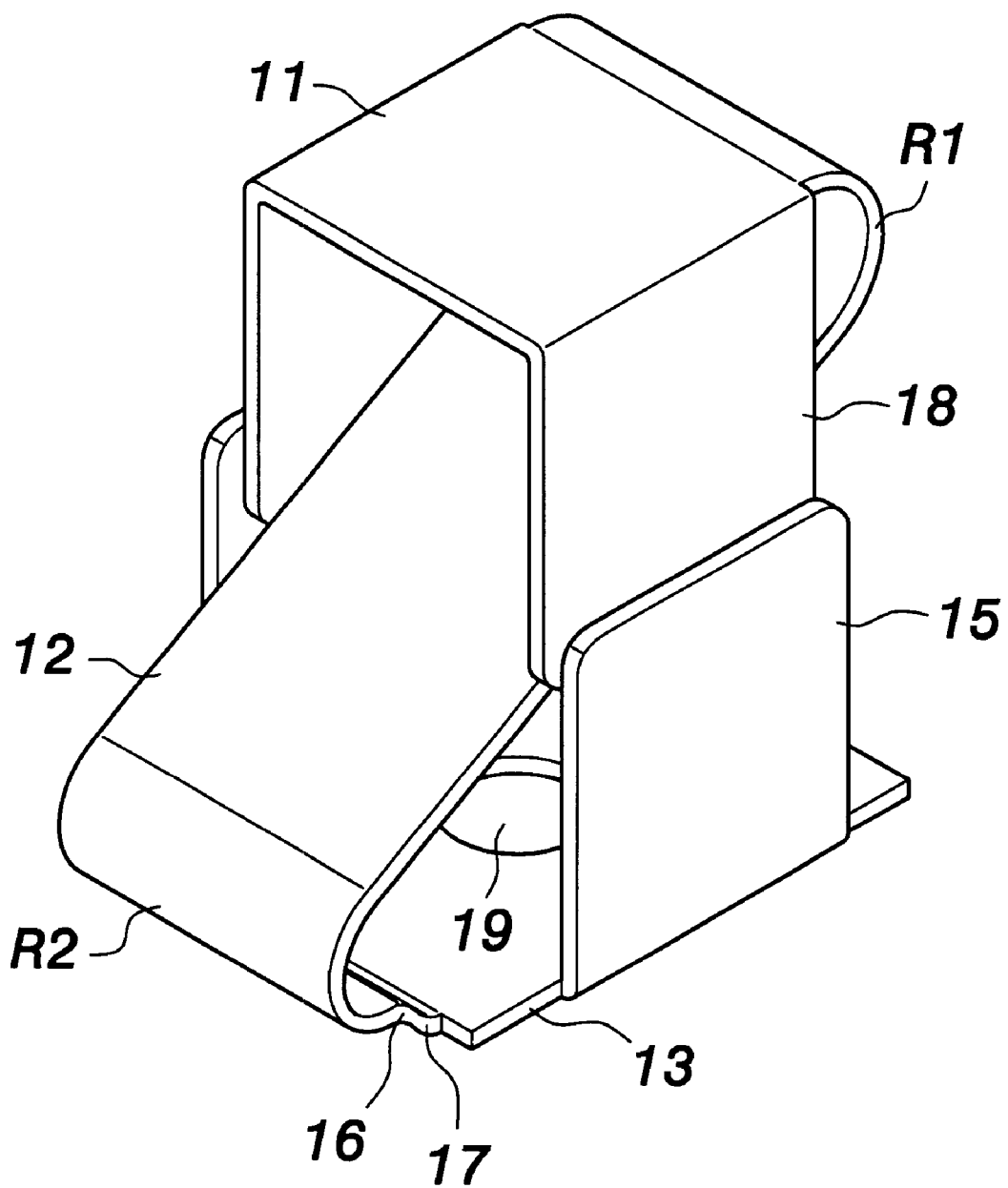
FIG. 3 is a structure view of the present invention.
Figure 4:
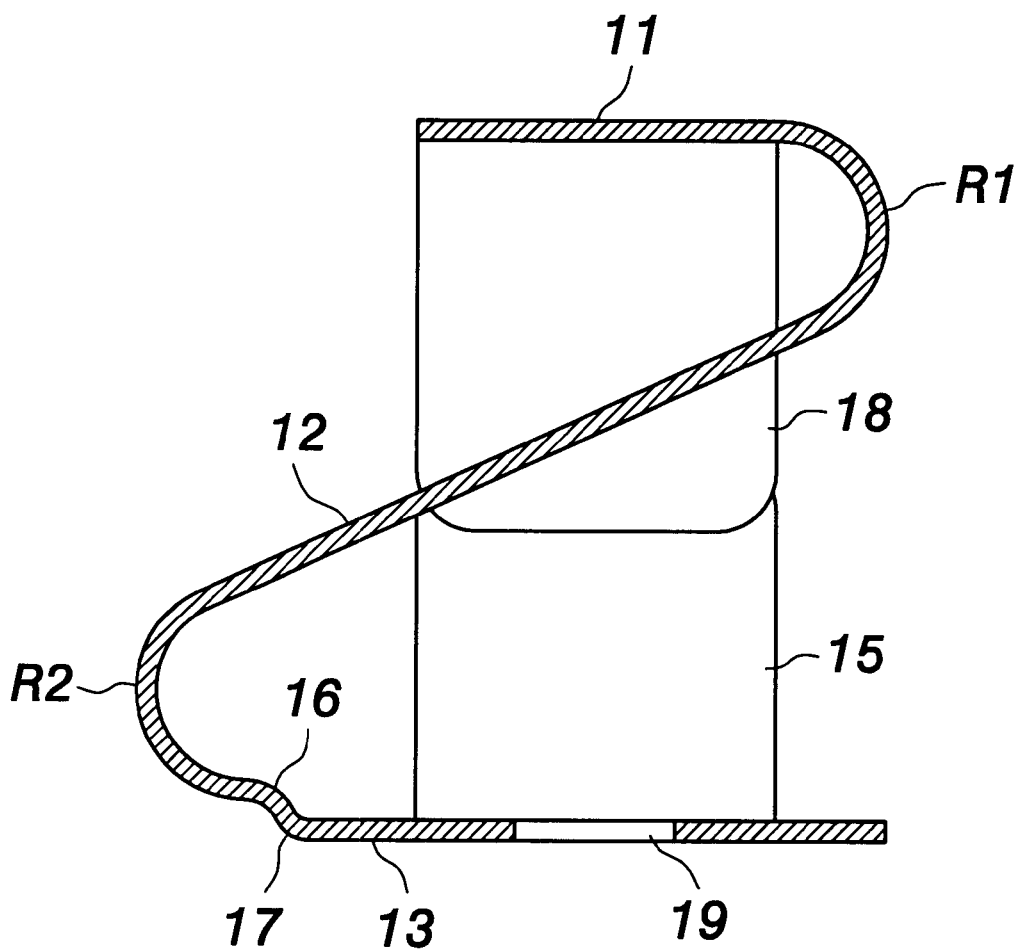
FIG. 4 is a cross sectional view of the present invention.
Figure 5:
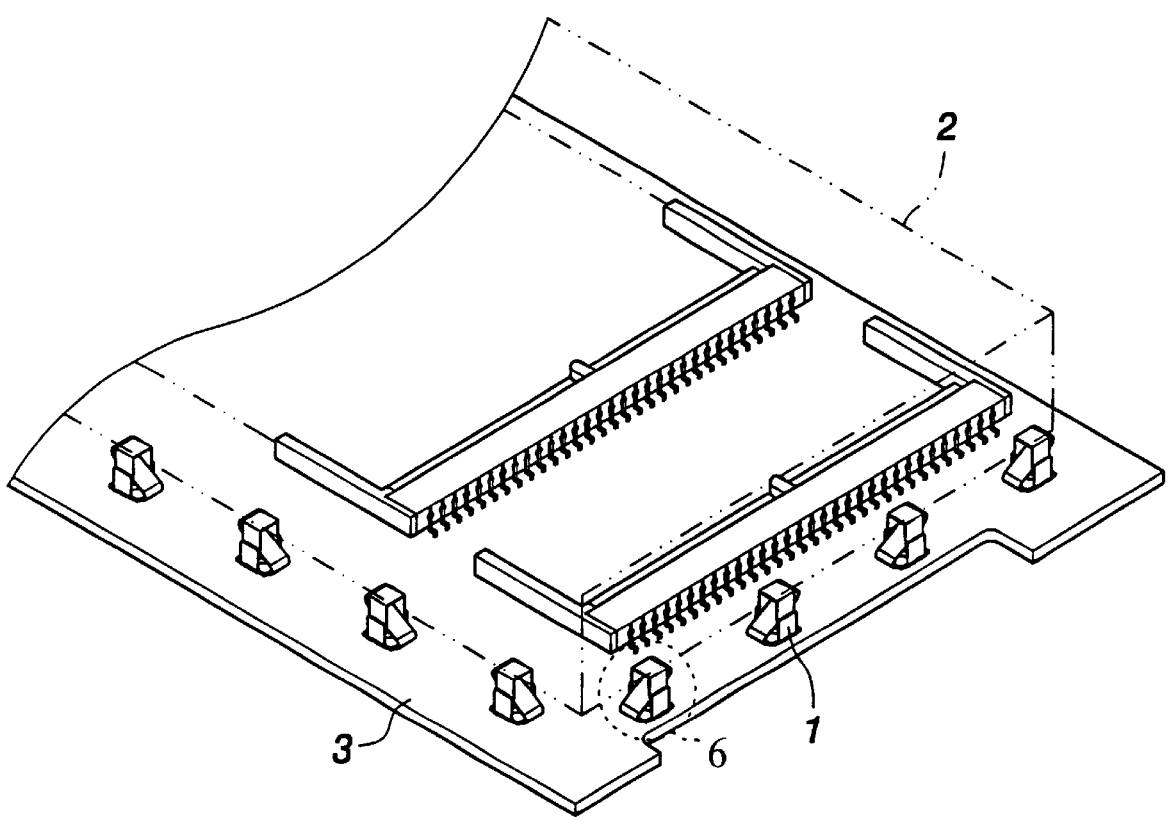
FIG. 5 shows one embodiment of the elastic system for preventing electromagnetic interference to a computer central processing unit according to the present invention.

Referring to FIGS. 3 to 5, the elastic system for preventing electromagnetic interference to a computer central processing unit of the present invention is illustrated. In the present invention, each elastic conductive piece 1 is installed with a piece-like contact surface 11 for resisting a lower edge of a cover 2. The outer side of the contact surface 11 has a sheet portion 12 extended therefrom. A first bending angle portion R1 is formed therebetween. The free end of the sheet portion 12 extends downwards to form a piece-like welding surface 13 and a second bending angle portion R2 is formed therebetween. An enhanced portion 16 is formed between the lower edge of the second bending angle portion R2 and the welding surface 13. A selective tilt surface 17 is formed between the lower end of the enhanced portion 16 and the welding surface 13. The enhanced portion 16 has a distance of 0.2 mm to the computer mainframe board 3. The inner surface of the second bending angle portion R2 has a configuration with respect to the inner surface of the first bending angle portion R1. A hole 19 is formed on the welding surface 13. Since the welding surface 13 is combined to the computer mainframe board 3 through a tin glue 4. Therefore, the computer mainframe board 3 has a preferred sticky force. Two lateral sides of the contact surface 11 and the welding surface 13 are extended with a vertical upper stopper 15 and a vertical lower stopper 18. The upper portions of the upper stopper 15 and the lower stopper 18 are alternatively arranged. Therefore, each elastic conductive piece has a closed structure. No outer object will be hooked or fall thereinto.

Figure 6:
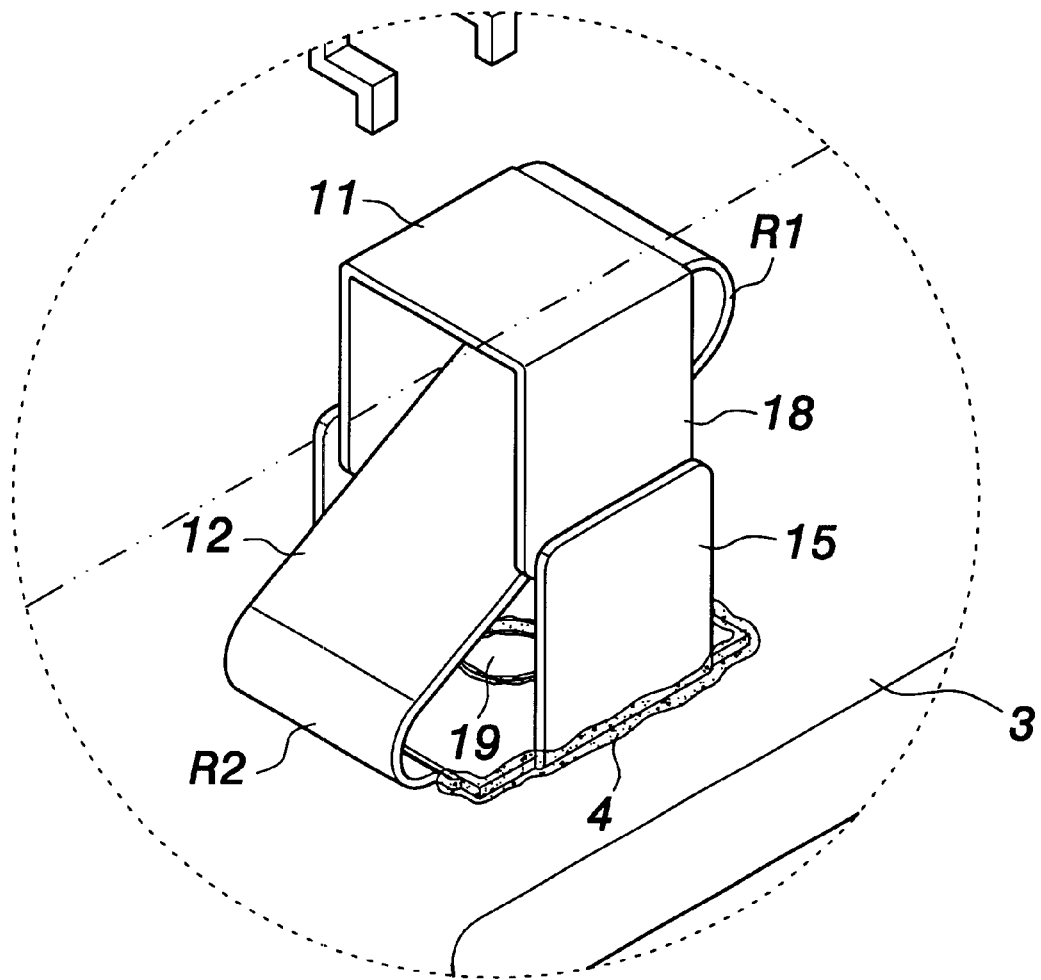
FIG. 6 is a schematic view showing the combination of a single elastic conductive piece and a computer mainframe board.

Referring to FIGS. 5 to 6, the elastic conductive piece 1 of the present invention is used to a computer mainframe board 3. A plurality of elastic conductive pieces 1 are arranged on the microprocessor of the computer mainframe board 3 and the periphery of a memory. The arranged distances of the elastic conductive pieces 1 are determined according to the function of the microprocessor. The distance of two elastic conductive pieces 1 is based on the standard of EMI. A cover is connected to the contact surface 11 of each elastic conductive piece 1 for shielding the electromagnetic wave radiated from the processor and memory.

Thereby, as the elastic conductive piece 1 is assembled to a computer mainframe board 3, no outer object will be hooked and fall thereinto.

In summary, by the structure of the present invention, all the elastic conductive pieces are formed as a closed loop so that no outer object will be hooked. More tin glue 4 may be permeated into the connecting portion of the welding surface 13 and the computer mainframe board 3. Thereby, each elastic conductive piece 1 and the computer mainframe board 3 are well connected.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An elastic system for preventing electromagnetic interference to a computer central processing unit comprising an elastic conductive piece, said elastic conductive piece being installed with a piece-like contact surface; an outer side of the contact surface has a sheet portion extended therefrom; a first bending angle portion being formed therebetween; a free end of the sheet portion extending downwards to form a piece-like welding surface and a second bending angle portion being formed therebetween; an enhanced portion being formed between a lower edge of the second bending angle portion and the welding surface; characterized in that:

two lateral sides of the contact surface and the welding surface are extended with a vertical upper stopper and a vertical lower stopper; upper portions of the upper stopper and the lower stopper are alternatively arranged.

2. The elastic system for preventing electromagnetic interference to a computer central processing unit as claimed in claim 1, wherein the welding surface is formed with a hole.

* * * * *